United States Patent
Ishikawa

(10) Patent No.: US 6,716,725 B1
(45) Date of Patent: Apr. 6, 2004

(54) PLASMA PROCESSING METHOD AND SEMICONDUCTOR DEVICE

(75) Inventor: Hiraku Ishikawa, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/387,771

(22) Filed: Sep. 1, 1999

(30) Foreign Application Priority Data

Sep. 2, 1998 (JP) .......................................... 10-264021

(51) Int. Cl.$^7$ .................. H01L 21/20; H01L 21/31; H01L 21/469; H05H 1/24; C23C 8/00
(52) U.S. Cl. .................. 438/485; 438/784; 438/788; 438/478; 427/569; 427/585
(58) Field of Search ................................ 438/478, 485, 438/783, 788, 784; 427/569, 585

(56) References Cited

U.S. PATENT DOCUMENTS

| | | | | |
|---|---|---|---|---|
| 4,485,125 A | * | 11/1984 | Izu et al. | 427/74 |
| 4,521,447 A | * | 6/1985 | Ovshinsky et al. | 438/96 |
| 5,017,308 A | * | 5/1991 | Iijima et al. | 252/501.1 |
| 5,413,967 A | * | 5/1995 | Matsuda et al. | 438/783 |
| 5,633,211 A | * | 5/1997 | Imai et al. | 438/760 |
| 5,660,895 A | * | 8/1997 | Lee et al. | 427/579 |
| 5,703,404 A | * | 12/1997 | Matsuura | 257/758 |
| 5,840,631 A | * | 11/1998 | Kubo et al. | 438/789 |
| 5,927,994 A | * | 7/1999 | Kohda et al. | 438/478 |
| 6,230,650 B1 | * | 5/2001 | Yamazaki | 118/723 ME |
| 6,391,394 B1 | * | 5/2002 | Shirasuna et al. | 427/569 |
| 6,410,102 B1 | * | 6/2002 | Hashizume et al. | 427/534 |
| 6,500,500 B1 | * | 12/2002 | Okamura | 427/569 |

* cited by examiner

*Primary Examiner*—Matthew Smith
*Assistant Examiner*—Chuong A Luu
(74) *Attorney, Agent, or Firm*—Finnegan, Henderson, Farabow, Garrett & Dunner, LLP

(57) ABSTRACT

A wafer W is placed on a lower electrode 108 provided inside a processing chamber 102 of a CVD apparatus 100 and is heated to achieve a temperature equal to or greater than 350° C. and lower than 450° C. $SiH_4$ and $SiF_4$ with both their flow rates set at 20 sccm, $B_2H_6$ with its flow rate set at 7 sccm, $O_2$ with its flow rate set at 200 sccm and Ar with its flow rate set at 400 sccm are introduced into the processing chamber 102, and a pressure within the range of 0.01 Torr~10 Torr is set. 20 W/cm$^2$ power at a frequency of 27.12 MHz and 10 W/cm$^2$ power at a frequency of 400 kHz are respectively applied to an upper electrode 116 and the lower electrode 108 to generate plasma, and a layer insulating film 204 constituted of an SiOB film containing F is formed on the wafer W. With the B atoms incorporated into the molecular skeleton in the network structure of the SiOB film and the F atoms lowering the hygroscopicity by preventing formation of Si—OH bonds and the like, a dielectric constant of approximately 3.0 is achieved.

18 Claims, 2 Drawing Sheets

PLASMA PROCESSING METHOD AND SEMICONDUCTOR DEVICE

BACKGROUND OF THE INVENTION

The present invention relates to a plasma processing method and a semiconductor device.

There are plasma processing methods that have been proposed in the prior art through which film formation processing is implemented on a target object such as a semiconductor wafer (hereafter referred to as a "wafer"). In one such method, for instance, after mounting a wafer on a lower electrode provided within an airtight processing chamber, the wafer is heated to a specific temperature. Then, a processing gas such as $SiH_4$ (silane), TEOS (tetra-ethoxy silane) or the like is introduced into the processing chamber while maintaining the atmosphere within the processing chamber at a specific reduced pressure. Next, high frequency power for plasma generation is applied to an upper electrode facing the lower electrode and high frequency power for biasing is applied to the lower electrode, to generate plasma by dissociating the processing gas. In the next step, a layer insulating film constituted of $SiO_2$ (silicon dioxide) is formed on the Si (silicon) substrate constituting the wafer, using the plasma.

The adoption of a multilayer wiring structure on an Si substrate achieved by laminating wiring films over a plurality of layers via layer insulating film has become essential to support ultra-fine semiconductor elements of various types formed at the wafer and the ultra-high integration that have been achieved in recent years. In addition, with the design rules for designing semiconductor devices becoming further reduced, the wiring films are positioned in closer proximity to each other and the layer insulating film is becoming even thinner. However, if an $SiO_2$ film having a dielectric constant of approximately 3.9 is utilized to constitute the layer insulating film, as in the prior art, the capacity between the wirings (incidental capacity) increases and, as a result, the transmission of electrical signals is delayed to result in a reduction in the high-speed operability. Consequently, it is difficult to drive at a low voltage, and moreover, it is difficult to operate at a high clock frequency.

As a solution, a method of lowering the capacity between the wirings by employing a film with a low dielectric constant which has a dielectric constant lower than that of $SiO_2$ to constitute the layer insulating film has been proposed. The film with a low dielectric constant employed in such a method may be a film constituted of an organic material or a film constituted of an inorganic material. The dielectric constants of a polyimide resin film and a fluorine-containing resin film, either of which may constitute the organic film are 3.0~3.5 and 1.9~2.7 respectively, and are much lower than that of the $SiO_2$ film. However, organic films do not possess a significant degree of heat resistance due to their poor strength in their molecular structures, and they do not facilitate machining either. In addition, the conformability of organic films to the existing processing methods is poor, which makes it difficult to form various types of elements.

In contrast, an inorganic film such as an SiOF (silicon oxide containing fluorine) film having a dielectric constant of approximately 3.5 has a relatively stable molecular structure, and therefore, unlike the organic films described above, achieves advantages including superior heat resistance, good machinability and good conformability to existing processing methods. In addition, the SiOF film may be processed using an existing film formation apparatus through an existing film formation method by using a mixed gas constituting of, for instance, $SiH_4$ and $SiF_4$ for the processing gas. Furthermore, since the dielectric constant of the SiOF film has dependency on the content of the F (fluorine) atoms in the film, the dielectric constant can be reduced by increasing the content of the F atoms.

However, when the F atom content in the SiOF film is increased, the hygroscopicity of the film itself becomes higher in proportion to the increase. According to the observation made by the inventors, this increase in the hygroscopicity may be attributable to the following factor. Namely, the $SiO_2$ film has a molecular structure expressed as;

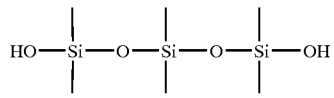

with an —OH (hydroxyl group) bond at its trailing end. When F atoms are added into the $SiO_2$ film at a quantity at which no hygroscopicity manifests, e.g., at 10 mol % ~20 mol %, to set the dielectric constant to approximately 3.5, the —OH is replaced by —F, and the molecular structure expressed as;

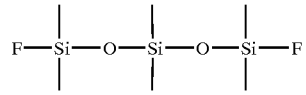

is achieved. In addition, if F atoms are added into the SiOF film at a ratio exceeding 20 mol % to further reduce the dielectric constant of the SiOF film, the molecular structure changes to

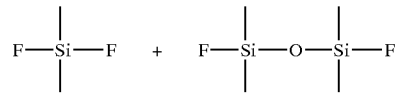

with the O (oxygen) atom that has been bonded to the two Si atoms replaced by F atoms, thereby destroying the network structure of the $SiO_2$ film. It is assumed that the resulting series of reactions, whereby a reaction occurs between the Si (—F)$_2$ bond formed within the SiOF film and $H_2O$ (water) present in the atmosphere and the like to induce hydrolysis and an Si—OH bond is formed, raises the hygroscopicity of the SiOF film.

In addition, when the SiOF film absorbs moisture, HF (hydrogen fluoride) is created, which corrodes any metal in contact with the layer insulating film, such as that constituting the wiring films, to damage the element. Furthermore, if HF becomes diffused inside the processing chamber, it contaminates the processing chamber and may also cause corrosion of various members and the exhaust system provided inside the processing chamber. Moreover, HF reduces the pH (approximately 9~11) of the slurry used as a polishing agent when flattening the layer insulating film through CMP (chemical mechanical polishing), which results in a reduction in the polishing speed.

A first object of the present invention which has been completed by addressing the problems of the prior art discussed above is to provide a new and improved plasma processing method and a new and improved semiconductor device, which make it possible to form an SiOF film having a low dielectric constant that demonstrates no substantial hygroscopicity.

In addition, in the prior art, if the $SiO_2$ film is in contact with a metal such as Ti (titanium), the Ti and the O in the $SiO_2$ become bonded at the interface to result in the formation of a bridge structure such as —Ti—O—Si— and, as a result, a specific bond strength is achieved. However, if F is present in the $SiO_2$ film during this process, the bond of the —Ti—O—Si— is broken into —Ti—F, H—O—Si and the like, which presents a problem in that the bond with the metal such as that constituting the wiring films in contact with the SiOF film is weakened.

A second object of the present invention which has been completed by addressing the problem of the prior art discussed above is to provide a new and improved plasma processing method and a new and improved semiconductor device, which make it possible to form an SiOB (silicon oxide containing boron) film having a low dielectric constant that achieves a strong bond with the metal material.

SUMMARY OF THE INVENTION

In order to achieve the objects described above, in a first aspect of the present invention, a plasma processing method for implementing film formation processing on a target object placed within a processing chamber by transforming a processing gas introduced into the processing chamber into plasma, that includes a step in which a gas that is constituted of, at least, a gas containing silicon atoms, a gas containing oxygen atoms, a gas containing boron atoms and a gas containing fluorine atoms is introduced as the processing gas into the processing chamber and film constituted of a silicon oxide-type material is formed at the target object by incorporating at least the boron atoms and the fluorine atoms into the molecular structure, is provided.

In this method, by introducing the B atoms into the network structure of the Si—O bond in the $SiO_2$ film, for instance, a B—O bond network is formed within the network constituted of the Si—O bond. Since the B atom is relatively small compared to the Si atom, the O atom and the F atom, the degree of electronic polarization is reduced in the B—O bond formed within the silicon oxide-type film. As a result, the dielectric constant of the film can be lowered. In addition, by adding the F atoms, the B—OH bond within the film is replaced by a B—F bond to achieve a reduction in B—OH bonds that would otherwise cause hygroscopicity. Since an Si (—F)$_2$ bond having a degree of hygroscopicity is formed if the F atoms are added in an excessively large quantity during this process, the quantity of the F atoms to be added is set within a range of, for instance, 2% ~4% in terms of the number of Si—F bonds/number of Si—O bonds.

In addition, the dielectric constant of the SiOB film with F atoms added is reduced through an increase in B atoms instead of through an increase in F atoms, which is the case in an SiOF film. Consequently, a dielectric constant comparable to that of the organic film mentioned earlier can be achieved by increasing the quantity of B atoms that are added without having to increase the quantity of F atoms, which would damage the Si—O bond network structure and reduce the bond strength with a metal, as explained above. Furthermore, since an $SiO_2$ film, for instance, is formed at the target object by incorporating at least B atoms and F atoms into the molecular structure during the process of film formation, the B atoms and the F atoms are distributed evenly within the SiOB film containing F.

Moreover, by setting the quantity of boron atoms in the processing gas equal to or lower than 50% of the quantity of silicon atoms in the processing gas, a stable $SiO_2$ film achieving a high degree of reliability can be formed.

In addition, by implementing a step in which a gas that contains at least carbon atoms is caused to react with the boron atoms and the fluorine atoms constituting the surface of the silicon oxide film following the step in which the silicon oxide film is formed, SiC (silicon carbide) and BC (boron carbide) that do not react with $H_2O$ readily can be formed at the surface. As a result, the hygroscopicity of the exposed surface of the SiOB film containing F, in particular, that is exposed to the atmosphere and therefore, would absorb moisture readily, can be reduced. Furthermore, since the SiC and the BC mentioned above achieve a strong bond with the metal constituting the wiring film and the like, an element having an ultra high density can be formed.

As an alternative, a step in which a gas containing at least nitrogen atoms may be caused to react with the boron atoms and the fluorene atoms constituting the surface of the silicon oxide film may be implemented after the silicon oxide film is formed, to form SiN (silicon nitride) and BN (boron nitride) that also achieves a good bond strength when bonding with a metal without readily absorbing moisture.

Alternatively, after the step in which the silicon oxide film is formed, a step in which a gas containing at least hydrogen atoms is caused to react with the boron atoms and the fluorine atoms constituting the surface of the silicon oxide film may be implemented. By employing this method, the film surface can be terminated with a B—H bond or an Si—H bond, which makes it possible to form a film having a low dielectric constant that does not absorb moisture readily and achieves a strong bond with metal.

In addition, by implementing a step in which a gas containing at least carbon atoms is caused to react with the boron atoms and the fluorine atoms constituting the surface of the silicon oxide film after the step in which a reaction is caused with the gas containing hydrogen, the Si—C bond and the B—C bond mentioned earlier can be formed even more easily, so that a film having a low dielectric constant that does not absorb moisture readily and achieves good adhesion with metal is formed.

Furthermore, by implementing a step in which a gas containing at least nitrogen atoms is caused to react with the boron atoms and the fluorine atoms constituting the surface of the silicon oxide film after the step in which a reaction is caused with the gas containing hydrogen, the Si—N bond and the B—N bond described above can be formed even more easily, to reduce the degree of hygroscopicity and improve the adhesion with the metal.

In a second aspect of the present invention, a semiconductor device that includes an insulating film constituted of a silicon oxide material achieved by incorporating at least boron atoms and fluorine atoms into its molecular structure is provided.

In this structure, which utilizes an SiOB film constituted by incorporating F atoms into the molecular skeleton as the insulating film, the network structure of the Si—O bond can be maintained, the degree of anti-hygroscopicity can be improved through the addition of F atoms and the dielectric constant can be lowered.

In addition, by setting the quantity of boron atoms within the insulating film fundamentally equal to or less than 50% of the quantity of silicon atoms in the insulating film, a stable insulating film achieving a high degree of reliability can be formed, as has been explained in reference to the invention defined in claim 2.

Furthermore, by setting the ratio (Si—F/Si—O) of the number of bonds (Si—F) between silicon atoms and fluorine atoms and the number of bonds (Si—O) between silicon atoms and oxygen atoms to 2% ~4%, as in the invention defined in claim 10, for instance, the formation of the Si—OH bond and the H—OH bond in the insulating film is prevented, so that even when the film is exposed to the atmosphere, the film is prevented from absorbing moisture.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate a preferred embodiment. In the drawings.

DETAILED DESCRIPTION OF THE PREFERRED EMBODIMENT

The following is an explanation of an embodiment realized by utilizing the plasma processing method and the semiconductor device according to the present invention in a film formation method, an exposed surface processing method and a layer insulating film, given in reference to the attached drawings.

(1) Overall Structure of the Film Formation Apparatus.

Figure 1:
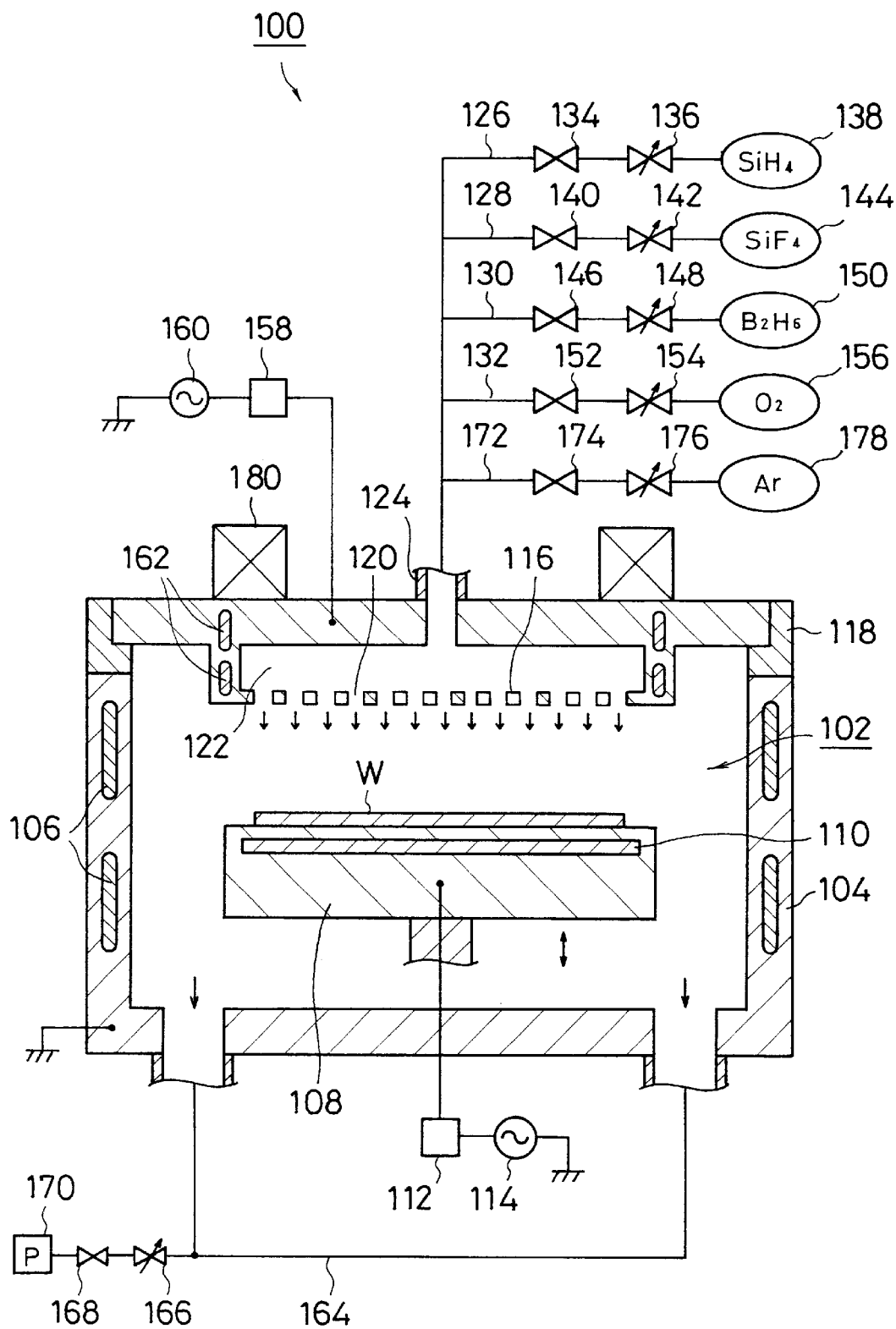
FIG. 1 is a schematic cross section of a plasma CVD apparatus which may employ the present invention.

First, in reference to FIG. 1, a preferred embodiment of a plasma CVD apparatus 100 which may employ the present invention is explained.

A processing chamber 102 of the CVD apparatus 100 illustrated in FIG. 1 is formed within a conductive processing container 104 that is grounded. The processing container 104 is internally provided with a heater 106. In addition, an electrically conductive lower electrode 108, which also functions as a mounting table on which a wafer W is placed, is provided inside the processing chamber 102. The lower electrode 108 is also internally provided with a heater 110. A first high-frequency power supply 114 is connected to the lower electrode 108 via a matcher 112. A conductive upper electrode 116 is also provided inside the processing chamber 102, facing the mounting surface of the lower electrode 108. Furthermore, an insulating member 118 is provided between the upper electrode 116 and the processing container 104.

In addition, a great number of gas discharge holes 120 and a gas diffusion chamber 122 are formed at the upper electrode 116. A specific type of processing gas is supplied into the gas diffusion chamber 122 via a gas supply pipe 124. In the example presented in FIG. 1, first~fifth branch pipes 126, 128, 130, 132 and 172 are connected to the gas supply pipe 124. In addition, first~fifth gas supply sources 138, 144, 150, 156 and 178 are respectively connected to the first~fifth branch pipes 126, 128, 130, 132 and 172 via open/close valves 134, 140, 146, 152 and 174 and also via flow-rate regulating valves 136, 142, 148, 154 and 176 respectively.

A second high frequency power supply 160 is connected to the upper electrode 116 via a matcher 158. The upper electrode 116 is internally provided with a heater 162. Furthermore, a magnet 180 which is capable of generating a magnetic field having an intensity of, for instance, approximately 9.7 gauss in the plasma generation area formed within the processing chamber 102 is provided above the upper electrode 116. Exhaust manifold 164 is connected to a lower portion inside the processing container 104. A vacuum pump 170 is connected to the exhaust manifold 164 via an exhaust quantity regulating valve 166 and an open/close valve 168.

(2) Film Formation Step

Next, in reference to FIGS. 1 and 2, the film formation step, in which a layer insulating film constituted of an SiOB film containing F in the embodiment is formed at a target surface of the wafer W, is explained.

Figure 2A:
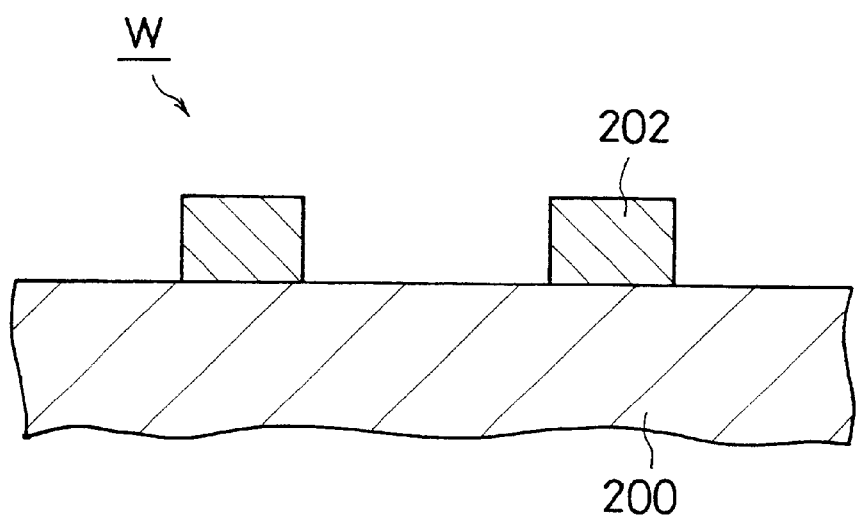
FIG. 2 is a schematic cross section of a wafer processed by the plasma CVD apparatus shown in FIG. 1.

First, the wafer W having wiring films 202 constituted of an Al (aluminum) alloy formed on an Si substrate 200 as illustrated in FIG. 2(a), for instance, is placed on the lower electrode 108 shown in FIG. 1. The wafer W is then heated to achieve a temperature equal to or greater than 350° C. and lower than 450° C., for instance, by the heater 110 via the lower electrode 108, and the temperature is maintained at this level. In addition, the processing container 104 is heated to 80° C. ~200° C., for instance, by the heater 106, whereas the upper electrode 116 is heated to achieve a temperature within the range of, for instance, 80° C. ~200° C. by the heater 162.

Next, a processing gas is introduced into the processing chamber 102, and in addition, vacuum suction is performed in the processing chamber 102 to maintain the atmosphere within at a specific reduced pressure. In the example illustrated in FIG. 1, $SiH_4$ is supplied from the first gas supply source 138 as an Si source, $SiF_4$ is supplied from the second gas supply source 144 as an F source and $B_2H_6$ is supplied from the third gas supply source 150 as a B source. In addition, $O_2$ is supplied from the fourth gas supply source 156, and Ar is supplied from the fifth gas supply source 178. The flow rate of $SiH_4$ is substantially controlled to 20 sccm by the flow-rate regulating valve 136, the flow rate of $SiH_4$ is substantially controlled to 20 sccm by the flow-rate regulating valve 142 and flow rate of $B_2H_6$ is substantially controlled to 7 sccm by the flow-rate regulating valve 148. Furthermore, the flow rate of $O_2$ is controlled to 100 sccm by the flow-rate regulating valve 154, and the flow rate of Ar is controlled to 400 sccm by the flow-rate regulating valve 176. Consequently, the quantity of B atoms in the processing gas is set to approximately 35% of the quantity of the Si atoms in the processing gas. The pressure inside the processing chamber 102 is set within a range of, for instance, 0.01 Torr ~10 Torr by the exhaust quantity regulating valve 136.

Figure 2B:
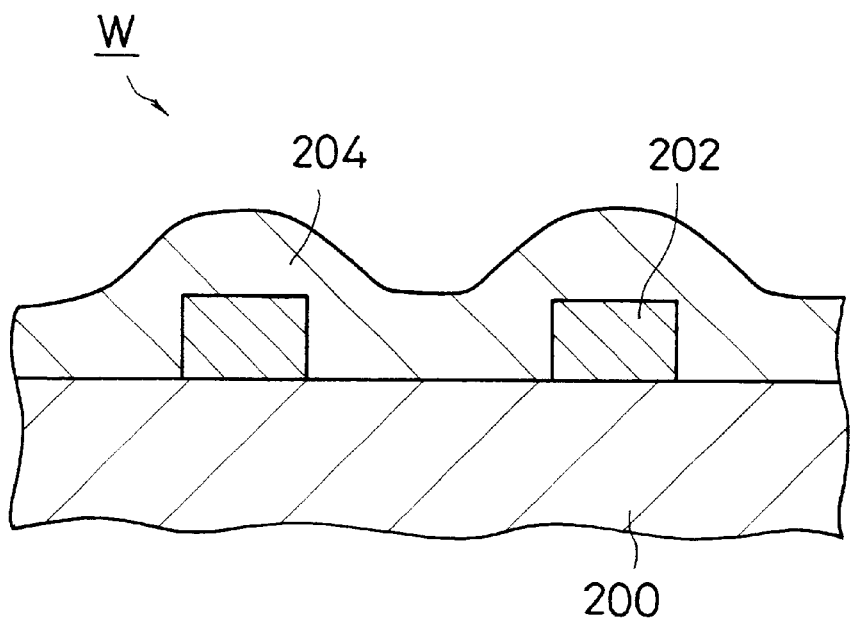

Then, 20 $W/cm^2$ high frequency power for plasma generation is applied to the upper electrode 116 from the second high frequency power supply 160 at a frequency of, for instance, 27.12 MHz, and 10 $W/cm^2$ high frequency power for biasing is applied to the lower electrode 108 from the first high frequency power supply 114 at a frequency of, for instance, 400 kHz. This causes the processing gas introduced into the processing chamber 102 to dissociate, to result in generation of plasma, the radicals and ions in the plasma are drawn to the target surface of the wafer W and a layer insulating film 204 constituted of an SiOB film containing F illustrated in FIG. 2(b) is formed at the target surface.

The change that the molecular structure undergoes until the layer insulating film 204 is formed is now explained. First, during the initial stage of the film formation process, Si ions, O ions and H ions in the plasma generated through dissociation of the processing gas bond with one another, and an $SiO_2$ film having a molecular structure expressed as;

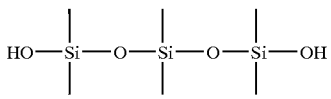

with —OH present on the surface is formed. Then, when B is introduced into the Si—O—Si skeleton of the $SiO_2$ film, i.e., when a plurality of $SiO_2$ molecules bond via B atoms, an $SiO_2$ film containing B having a molecular structure expressed as;

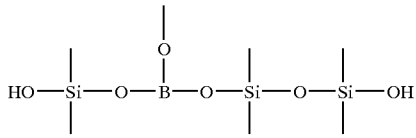

is formed. Next, the —OH constituting the surface of the $SiO_2$ film containing B is replaced by F ions in the plasma, and an SiOB film containing F with —F present as expressed in;

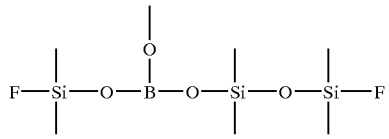

is formed. It is to be noted that the content of the B atoms in the SiOB film containing F should be set to equal to or less than 50% of the content of the Si atoms in the same film, and more preferably it should be set within the range of 10~45%. During the actual process of film formation, the individual reactions described above proceed almost simultaneously.

As explained above, by introducing B atoms into the $SiO_2$ film, the B atoms achieve a network structure together with the $SiO_2$ molecules, and unlike F atoms, the presence of the B atoms does not damage the $SiO_2$ network structure. In addition, in this embodiment, the film is formed by ensuring that the ratio (Si—F/Si—O) of the number of Si—F bonds and the number of Si—O bonds constituting the SiOB film containing F is set within the range of 2% ~4%. As a result, the layer insulating film 204 does not absorb moisture, since no Si $(—F)_2$ bonds are formed and furthermore, the —Si—O— constituting the main skeleton structure does not become disrupted to result in the formation of —Si—OH.

In addition, by introducing B atoms into the $SiO_2$ film, the dielectric constant is reduced compared to that of the $SiO_2$ film in the prior art described earlier. This phenomenon may be explained as follows. Namely, it is known that the dielectric constant becomes lower as the electronic polarization rate is reduced. The electronic polarization rate of $B^{3+}$ is $0.003 \times 10^{-24} cm^3$, the electronic polarization rate of $Si^{4+}$ is $0.017 \times 10^{-24} cm^3$ and the electronic polarization rate of $O^{2-}$ is $3.88 \times 10^{-24} cm^3$. Consequently, as a larger quantity of B atoms is added to the $SiO_2$ film, the dielectric constant of the film becomes lower.

Furthermore, it is also a known fact that the dielectric constant becomes lower relative to a reduction in the ion radius and radii of ions of $B^{3+}$, $Si^{4+}$ and $O^{2-}$ mentioned above have a relationship expressed as $B^{3+}<O^{2-}<Si^{4+}$. Thus, by adding B atoms into the $SiO_2$ film, the dielectric constant of the layer insulating film 204 can be lowered.

For the reasons given above, the addition of B atoms into the $SiO_2$ film lowers the dielectric constant without having to add F atoms.

(3) Exposed Surface Processing Implemented on SiOB Film Containing F

Next, by referring to FIG. 1 again, the exposed surface processing step performed on the layer insulating film 204 is explained. It is to be noted that since basically the process requirements pertaining to this step and the processing apparatus on which the step is implemented are practically identical to those of the film formation step explained earlier, the same reference numbers are assigned to components achieving almost identical functions and having almost identical structural features to preclude the necessity for a repeated explanation thereof.

First, after the film formation processing is completed as explained earlier, the wafer W having specific contact holes formed between the wiring films 202 by performing, for instance, etching processing on the layer installation film 204 as illustrated in FIG. 2(b) is again placed on the lower electrodes 108 shown in FIG. 1. Next, a mixed gas constituted of $CH_4$ (methane), $N_2$ with their flow rates controlled to, for instance, 50 sccm by flow-rate regulating valves (not shown) having structures almost identical to those of the flow-rate regulating valves 136, 142, 148, 154 and 176 and Ar with its flow rate controlled to 100 sccm by the flow-rate regulating valve 176 is introduced into the processing chamber 102. For this process, the temperature of the wafer W is set to, for instance, 400° C., and the temperature of the processing container 104 and the temperature of the upper electrode 116 are both set to for instance, 200° C. In addition, the pressure inside the processing chamber 102 is maintained at, for instance, 0.05 torr. Then, 2000 W high frequency power is applied to the upper electrode 116 at a frequency of, for instance, 27.12 MHz and 250 W high frequency power is applied to the lower electrode 108 at a frequency of, for instance, 400 kHz to cause dissociation of the processing gas. The C ions and the N ions generated through the dissociation of the processing gas are drawn into the layer insulating film 204 on the wafer W.

This causes a reaction between the B atoms and the F atoms present at the exposed surface of the SiOB film containing F with the C atoms or the N atoms mentioned above to form SiC bonds, SiN bonds, BC bonds and BN bonds. As a result, even if a wiring film constituted of, for instance, an Al alloy is formed inside the contact holes, the wiring film and the layer insulating film 204 can be adhered with a high degree of reliability. In addition, since no Si—F bond is present at the exposed surface of the SiOB film containing F, the wiring film, the inside of the processing chamber 102 and the like are prevented from becoming corroded.

In the embodiment which is structured as described above by adding F atoms into the molecular skeleton of the SiOB film, the dielectric constant can be lowered to a degree almost comparable to that of an organic film without damaging the network structure of the $SiO_2$ film, which would result in a higher degree of hygroscopicity and, as a result, the dielectric constant is reduced while maintaining a desired film quality. In addition, the dielectric constant can be reduced by increasing the quantity of added B atoms that maintain the molecular skeleton intact with a high degree of reliability without having to increase the quantity of F atoms to the degree to which the film quality is affected. As a result, the incidental capacity occurring between electrode films 202 via the layer insulating film 204 can be reduced to achieve an improvement in the high-speed operability of the semiconductor element. Furthermore, since the adherence between the layer insulating film 204 and the wiring films 202 is improved, a semiconductor device achieving a high degree of reliability is formed.

While the invention has been particularly shown and described with respect to preferred embodiment thereof by referring to the attached drawings, the present invention is not limited to these examples and it will be understood by those skilled in the art that various changes in form and detail may be made therein without departing from the spirit, scope and teaching of the invention.

For instance, while an explanation is given in reference to the embodiment on an example in which the film formation gas constituted of $SiH_4$, $SiF_4$ and $B_2H_2$ is utilized, the present invention is not restricted to this example. For instance, $Si_2H_6$ or TEOS may be utilized as the Si source, $F_2$, HF or CxFy (fluorocarbon) $+SF_6$ may be utilized as the F source, and $BF_3$, $B(CH_3)_3$ or $B(C_2H_5)_3$ may be utilized as the B source, to implement the present invention.

In addition, while an explanation is given in reference to the embodiment on an example in which $CH_4$, $N_2$ and Ar are utilized to constitute the processing gas for processing the exposed surface of the layer insulating film, the present invention is not restricted to this example. For instance, a gas containing C atoms such as CO or $CO_2$, or a gas containing N atoms such as $NH_3$, $NF_3$ or $NO_x$ may be utilized to implement the present invention by causing reactions between the B atoms and the F atoms constituting the exposed surface of the SiOB film containing F and the C atoms or the N atoms. As an alternative, a gas containing H atoms such as $CH_4$, $NH_3$ or $H_2O$ may be utilized as the processing gas to implement the present invention by causing reactions between the B atoms and the F atoms constituting the trailing end section described earlier and the H atoms. Since only the H atoms are substantially present at the trailing end portion as a result, Si—H bonds and B—H bonds that readily react with metal (M) are formed. With Si—M bonds and B—M bonds formed through the reactions of these bonds with the metal, the adherence with the metal can be increased.

Moreover, while an explanation is given in reference to the embodiment on an example in which the processing of the exposed surface of the layer insulating film is implemented after the formation of the contact holes at the layer insulating film, the present invention is not restricted to this example. For instance, the present invention may be implemented by successively performing the exposed surface processing described above using the same processing apparatus after the formation of the layer insulating film. In such a case, it is desirable to supply the processing gas for the exposed surface processing into the processing chamber 102 after, for instance, discharging the processing gas for film formation from the inside of the processing chamber 102. Moreover, the present invention may be implemented by performing the exposed surface processing on the layer insulating film concurrently during the formation of the layer insulating film using the same processing apparatus or by performing the exposed surface processing on the layer insulating film using a different processing apparatus after the formation of the layer insulating film.

In addition, while an explanation has been given in reference to the embodiment on an example in which a single CVD apparatus is utilized to perform the layer insulating film formation processing and the exposed surface processing on the layer insulating film, the present invention is not restricted to this example, and it may be implemented by employing separate plasma processing apparatuses to perform the film formation processing and the exposed surface processing. Furthermore, while an explanation has been given in reference to the embodiment on an example in which a parallel plates plasma CVD apparatus is employed to perform the film formation processing and the exposed surface processing, the present invention is not restricted to this example, and it may be employed in combination with various types of plasma processing apparatuses including, for instance, an ECR plasma processing apparatus.

According to the present invention, through which an insulating film having a dielectric constant comparable to that of an organic film can be formed, the capacity between the wirings can be reduced by utilizing the film to constitute, for instance, a layer insulating film. As EL result, the high-speed operability of the semiconductor element improves, drive at reduced power consumption and lower voltage is realized and operation at a high clock frequency is enabled. In addition, since the insulating film has substantially no hygroscopicity, substances such as HF are not generated even when the film is exposed to the atmosphere and, as a result, the metal constituting the wiring films and the like, the inside of the processing chamber at the film formation apparatus where the insulating film is formed and the like do not become corroded or polluted. Furthermore, since the insulating film and the metal films can be firmly adhered, a semiconductor element achieving a high degree of dependability can be formed.

The entire disclosure of Japanese Patent Application No. 10-264021 filed on Sep. 2, 1998 including specification, claims, drawings and summary is incorporated herein by reference in its entirety.

What is claimed is:

1. A process for depositing a silicon oxide insulating film on a target object in a processing chamber, said process comprising the steps of:

introducing a process gas, comprising a gas containing silicon atoms, a gas containing oxygen atoms, a gas containing boron atoms, and a gas containing fluorine atoms into said chamber, wherein the quantity of the boron atoms in the processing gas is 50% or less than the quantity of silicon atoms in the processing gas; and forming plasma from said process gas to deposit a silicon oxide film on said target object, wherein said silicon oxide film is formed by incorporating said boron atoms and said fluorine atoms into the molecular structure thereof;

introducing a gas containing, at least one of carbon atoms, nitrogen atoms, and hydrogen atoms to react with the boron atoms and the fluorine atoms constituting a surface of said silicon oxide film, implemented after said step in which said silicon oxide film is formed.

2. The process of claim 1 wherein;

the quantity of said boron atoms in said processing gas is within the range of 10~45% of the quantity of said silicon atoms in said processing gas.

3. The process of claim 1 further comprising:

a step in which a gas containing, at least, carbon atoms, is made to react with said boron atoms and said fluorine atoms constituting a surface of said silicon oxide film, implemented after said step in which a reaction with said gas containing hydrogen atoms is achieved.

4. The process of claim 1, further comprising:

a step in which a gas containing, at least, nitrogen atoms is made to react with said boron atoms and said fluorine atoms constituting a surface of said silicon oxide film, implemented after said step in which a reaction with said gas containing hydrogen atoms is achieved.

5. The process of claim 1 wherein:

said gas containing said silicon atoms is constituted of, at least, one type of gas selected from a group comprising $SiH_4$, $SiF_4$, $Si_2H_6$, and TEOS;

said gas containing said boron atoms is constituted of, at least, one type of gas selected from a group comprising $B_2H_6$, $BF_3$, $B(CH_3)_3$, and $B(C_2H_5)_3$;

said gas containing said fluorine atoms is constituted of, at least, one type of gas selected from a group comprising $F_2$, HF, and $C_xF_y$+$SF_6$.

6. The process of claim 1, wherein: said gas containing said oxygen atoms is $O_2$.

7. The process of claim 1 wherein:

said gas containing said carbon atoms is constituted of, at least, one type of gas selected from a group comprising $CH_4$, CO, and $CO_2$;

said gas containing said nitrogen atoms is constituted of, at least, one type of gas selected from a group comprising $N_2$, $NH_3$, $NF_3$, and $NO_x$;

said gas containing hydrogen atoms is constituted of, at least, one type of gas selected from a group comprising $CH_4$, $NH_3$, and $H_2O$.

8. The process of claim 1 wherein;

the ratio (Si—F/Si—O) of the number of bonds (Si—F) and the number of bonds (Si—O) in the silicon oxide film is set substantially within a range of 2%–4%.

9. A process for depositing a silicon oxide insulating film on a target object in a processing chamber, said process comprising the steps of:

introducing a process gas comprising a gas containing silicon atoms, a gas containing oxygen atoms, a gas containing boron atoms, and a gas containing fluorine atoms into said chamber; and forming a plasma from said process gas to deposit a silicon oxide film on said target object, wherein said silicon oxide film is formed by incorporating an amount of said boron atoms and an amount of said fluorine atoms into the molecular structure thereof, the amount of said boron atoms in said silicon oxide film controlled by the amount of F atoms in the silicon oxide film to lower the dielectric constant of said silicon oxide film;

introducing a gas containing at least one of carbon atoms, nitrogen atoms, and hydrogen atoms to react with the boron and fluorine atoms constituting a surface of the silicon oxide film, implemented after said step in which said silicon oxide film is formed.

10. The process of claim 9 wherein:

said gas containing said silicon atoms is constituted of, at least, one type of gas selected from a group comprising $SiH_4$, $SiF_4$, $Si_2H_6$, and TEOS;

said gas containing said boron atoms is constituted of, at least, one type of gas selected from a group comprising $B_2H_6$, $BF_3$, $B(CH_3)_3$, and $B(C_2H_5)_3$;

said gas containing said fluorine atoms is constituted of at least one type of gas selected from a group comprising $F_2$, HF, and $C_xF_y$+$SF_6$.

11. The process of claim 9, wherein:

said gas containing said carbon atoms is constituted of, at least, one type of gas selected from a group comprising $CH_4$, CO, and $CO_2$;

said gas containing said nitrogen atoms is constituted of, at least, one type of gas selected from a group comprising $N_2$, $NH_3$, $NF_3$, and $NO_x$;

said gas containing hydrogen atoms is constituted of, at least, one type of gas selected from a group comprising $CH_4$, $NH_3$, and $H_2O$.

12. The process of claim 9 wherein;

the quantity of said boron atoms in said processing gas is within the range of 10–45% of the quantity of said silicon atoms in said processing gas.

13. The process of claim 9 wherein;

the ratio (Si—F/Si—O) of the number of bonds (Si—F) and the number of bonds (Si—O) in the silicon oxide film is set substantially within a range of 2%–4%.

14. A process for depositing a silicon oxide insulating film on a target object in a processing chamber, said process comprising the steps of:

introducing a process gas comprising a gas containing silicon atoms, a gas containing oxygen atoms, a gas containing boron atoms, and a gas containing fluorine atoms into said chamber, wherein the quantity of boron atoms in the insulating film is 50% or less than the quantity of silicon atoms in the insulating film;

forming a plasma from said process gas to deposit a silicon oxide film on said target object, wherein said silicon oxide film is formed by incorporating said boron atoms and said fluorine atoms into the molecular structure thereof;

introducing a gas containing at least one of carbon atoms, nitrogen atoms, and hydrogen atoms to react with the boron and fluorine atoms constituting a surface of the silicon oxide film, implemented after said step in which said silicon oxide film is formed.

15. The process of claim 14, wherein:

said gas containing said carbon atoms is constituted of, at least, one type of gas selected from a group comprising $CH_4$, CO, and $CO_2$;

said gas containing said nitrogen atoms is constituted of, at least, one type of gas selected from a group comprising $N_2$, $NH_3$, $NF_3$, and $NO_x$;

said gas containing hydrogen atoms is constituted of, at least, one type of gas selected from a group comprising $CH_4$, $NH_3$, and $H_2O$.

16. The process of claim 14 wherein;

the quantity of said boron atoms in said insulating film is within the range of 10–45% of the quantity of said silicon atoms in said insulating film.

17. The process of claim 14 wherein:

said gas containing said silicon atoms is constituted of, at least, one type of gas selected from a group comprising $SiH_4$, $SiF_4$, $Si_2H_6$, and TEOS;

said gas containing said boron atoms is constituted of, at least, one type of gas selected from a group comprising $B_2H_6$, $BF_3$, $B(CH_3)_3$, and $B(C_2H_5)_3$;

said gas containing said fluorine atoms is constituted of at least one type of gas selected from a group comprising $F_2$, HF, and $C_xF_y$+$SF_6$.

18. The process of claim 14 wherein;

the ratio (Si—F/Si—O) of the number of bonds (Si—F) and the number of bonds (Si—O) in the silicon oxide film is set substantially within a range of 2%–4%.

* * * * *

UNITED STATES PATENT AND TRADEMARK OFFICE
CERTIFICATE OF CORRECTION

PATENT NO. : 6,716,725 B1 Page 1 of 1
DATED : April 6, 2004
INVENTOR(S) : Hiraku Ishikawa It is certified that error appears in the above-identified patent and that said Letters Patent is hereby corrected as shown below:

Column 10,
Line 52, after "claim 1", insert a comma.

Column 11,
Line 9, after "claim 1", insert a comma.

Signed and Sealed this

First Day of June, 2004

JON W. DUDAS
*Acting Director of the United States Patent and Trademark Office*